(12) United States Patent
Kenyon

(10) Patent No.: US 10,305,704 B1
(45) Date of Patent: May 28, 2019

(54) DECISION FEEDBACK EQUALIZATION WITH INDEPENDENT DATA AND EDGE FEEDBACK LOOPS

(71) Applicant: TEXAS INSTRUMENTS INCORPORATED, Dallas, TX (US)

(72) Inventor: Eleazar Walter Kenyon, Tucker, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/002,648

(22) Filed: Jun. 7, 2018

(51) Int. Cl.
| H03H 7/30 | (2006.01) |
| H04L 25/03 | (2006.01) |
| H04L 7/033 | (2006.01) |
| H04L 27/00 | (2006.01) |

(52) U.S. Cl.
CPC ...... *H04L 25/03057* (2013.01); *H04L 7/0331* (2013.01); *H04L 27/0014* (2013.01); *H04L 2027/0067* (2013.01); *H04L 2027/0069* (2013.01); *H04L 2027/0075* (2013.01)

(58) Field of Classification Search
CPC .......... H04L 25/03057; H04L 27/0014; H04L 7/0331; H04L 2027/0069; H04L 2027/0075; H04L 2027/0067
USPC ....... 375/233, 218, 219, 230, 354, 375, 376; 327/7, 156
See application file for complete search history.

(56) References Cited

U.S. PATENT DOCUMENTS

| 8,270,464 B2 * | 9/2012 | Hidaka .............. H04L 25/03057 375/233 |
| 8,497,708 B2 | 7/2013 | Mukherjee et al. |
| 9,130,797 B1 * | 9/2015 | Palusa ............... H04L 25/03878 |
| 9,397,868 B1 * | 7/2016 | Hossain ............ H04L 25/03057 |
| 2009/0074123 A1 | 3/2009 | Hsueh et al. |
| 2012/0128055 A1 * | 5/2012 | Jiang ................. H04L 25/03057 375/233 |
| 2012/0155530 A1 | 6/2012 | Zhong |
| 2014/0140385 A1 * | 5/2014 | Ye .......................... H04L 27/01 375/230 |
| 2017/0373889 A1 * | 12/2017 | Sakai ............... H04L 25/03057 |

OTHER PUBLICATIONS

Chandramouli, Soumya. "A Novel Analog Decision-Feedback Equalizer in CMOS for Serial 10-GB/SEC Data Transmission Systems." Georgia Institute of Technology [Dissertation] Dec. 2007.
(Continued)

*Primary Examiner* — Dhaval V Patel
(74) *Attorney, Agent, or Firm* — John R. Pessetto; Charles A. Brill; Frank D. Cimino

(57) ABSTRACT

A receiver module includes a clock recovery circuit and a decision feedback equalizer (DFE) circuit. The DFE circuit includes a data feedback loop configured to sample an input data stream combined with equalization values based on a first clock signal. The DFE circuit also includes an edge feedback loop configured to sample the input data stream combined with equalization values based on a second clock signal. The clock recovery circuit is configured to determine a phase error between a receiver clock signal and a target clock signal based on output samples from the data feedback loop and the edge feedback loop.

21 Claims, 11 Drawing Sheets

(56) References Cited

OTHER PUBLICATIONS

Razavi, Behzad. "The Strong ARM Latch." IEEE Solid-State Circuits Magazine, Spring 2015, pp. 12-17.
Razavi, Behzad. "The Decision-Feedback Equalizer." IEEE Solid-State Circuits Magazine, Fall 2017, pp. 13-16, 132.
ECEN720: High-Speed Links Circuits and Systems Spring 2017. Lecture 8: RX FIR, CTLE, DFE & Adaptive Eq. Sam Palermo Analog & Mixed-Signal Center, Texas A&M University.

* cited by examiner

DECISION FEEDBACK EQUALIZATION WITH INDEPENDENT DATA AND EDGE FEEDBACK LOOPS

BACKGROUND

The proliferation of networked electronic devices continues along with related efforts to increase signaling speed while maintaining signal integrity. The core of a communication link consists of a transmitter that generates the signal, a channel that carries the signal and a receiver that accepts the signal and processes it correctly. Signals can be carried by channels as electrical signals, optical pulses, or electromagnetic signals. For accurate signaling between networked devices or components, the integrity of the signal needs to be maintained. From a physical layer standpoint, this means that if a "1" is sent from the transmitter and down the channel, be it copper, optical fiber or air, the receiver should also determine that the signal is a "1". This is a fundamental challenge for data transmission system and circuit designers due to the various factors affecting signal integrity.

Signal integrity in data transmission systems is affected by a number of factors. Apart from random noise, atmospheric and man-made noise, there are deterministic factors that contribute to deteriorating signal integrity. Copper-based signal transmission is affected by the limited bandwidth of copper channels and crosstalk from adjacent channels. Optical signals are affected by frequency-independent loss of optical power as they travel down the fiber as well as dispersion-causing mechanisms depending on the type of fiber. Bandwidth limitations in copper and pulse dispersion in optical fibers result in inter-symbol-interference (ISI) at the receiver. Typically, ISI deteriorates the signal as the data rate and the length of the channel increases. ISI is the primary factor limiting transmission distances over copper-based transmission channels and optical fiber at high data-rates (e.g., 10-Gb/sec). Efforts to compensate for ISI and otherwise maintain signal integrity has resulted in various transmitter-side and receiver-side technologies, including equalization.

Equalization is a process of conditioning the electrical signal, either at the transmitter or the receiver to compensate for channel-induced ISI and improve signal integrity. Linear and non-linear equalization techniques have been explored in the literature. One non-linear equalization technique is referred to as decision-feedback equalization (DFE). In DFE, a delay element is introduced into the receiver circuitry and equalization values are combined with an input data stream. To reach optimum DFE performance, the clock sampling edges should occur at the peaks of the combined signals, necessitating a clock recovery circuit (CDR). Also, the first "tap" equalization value should be chosen according to the actual channel response. DFE implementation in a CDR scenario with over-sampled phase detection is challenging due to stringent feedback timing and alignment requirements.

SUMMARY

In accordance with at least one example of the disclosure, a receiver module comprises a clock recovery circuit and a decision feedback equalizer (DFE) circuit. The DFE circuit comprises a data feedback loop configured to sample an input data stream combined with equalization values based on a first clock signal. The DFE circuit also comprises an edge feedback loop configured to sample the input data stream combined with equalization values based on a second clock signal that is different than the first clock signal. The clock recovery circuit is configured to determine a phase error between a receiver clock signal and a target clock signal based on output samples from the data feedback loop and the edge feedback loop.

In accordance with at least one example of the disclosure, a method comprises receiving an input data stream and using a data feedback loop to sample the input data stream combined with DFE values based on a first clock signal. The method also comprises using an edge feedback loop to sample the input data stream combined with DFE values based on a second clock signal that is different than the first clock signal. The method also comprises determining a phase error between a receiver clock signal and a target clock signal based on output samples from the data feedback loop and the edge feedback loop. The method also comprises using the determined phase error to adjust the receiver clock signal.

BRIEF DESCRIPTION OF THE DRAWINGS

For a detailed description of various examples, reference will now be made to the accompanying drawings in which.

DETAILED DESCRIPTION

Figure 1:
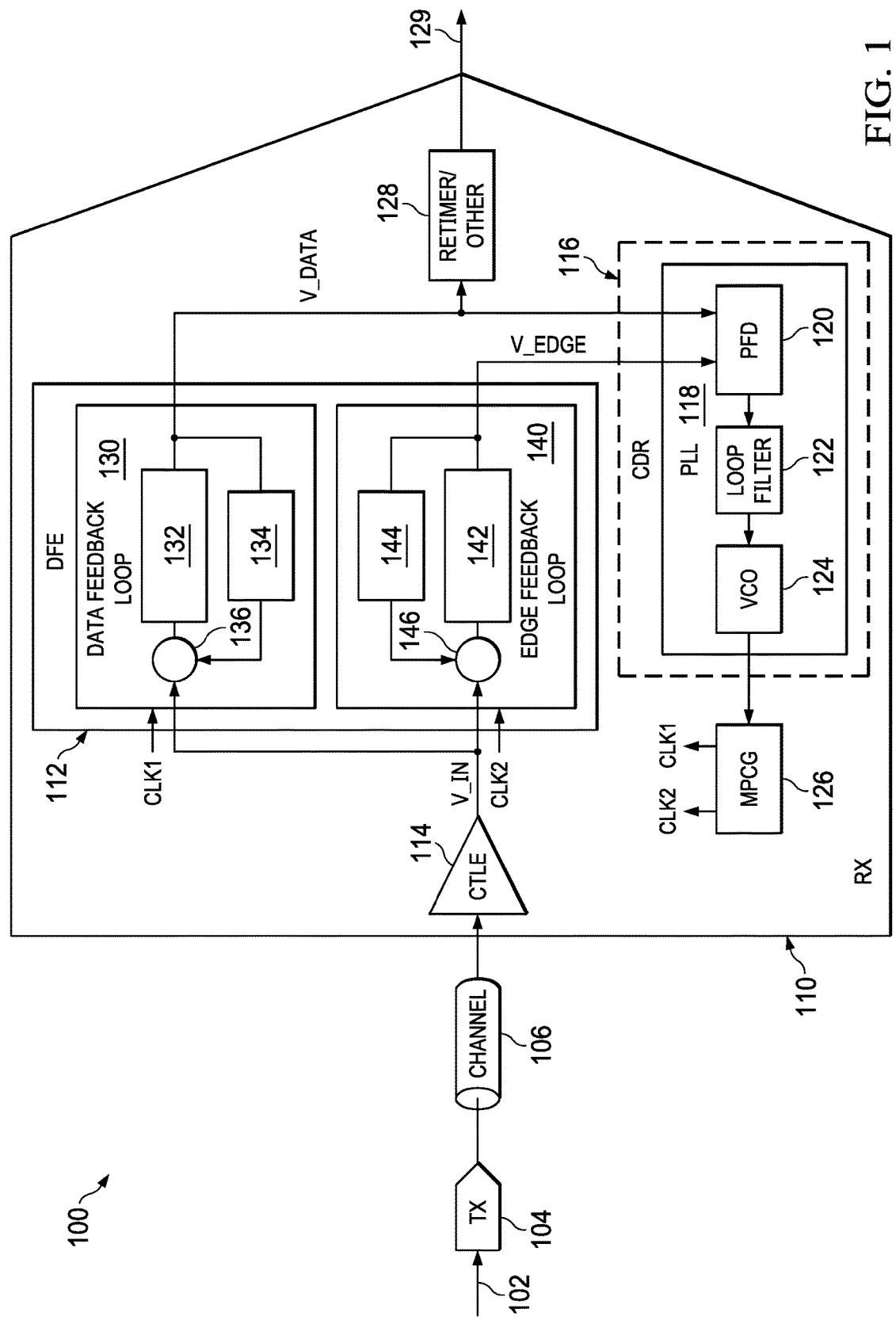
FIG. 1 shows a block diagram of a system with a decision feedback equalizer (DFE) circuit in accordance with various examples.

The disclosed examples are directed to receiver modules that employ a decision feedback equalizer (DFE) circuit with independent data and edge feedback loops. In some examples, the DFE circuit employs a direct feedback topology for each of the data feedback loop and the edge feedback loop. In other examples, the DFE circuit employs a loop unrolled topology for each of the data feedback loop and the edge feedback loop. Regardless of the particular topology used for the feedback loops, the DFE circuit uses different clock signals for sampling operations performed by the data feedback loop and the edge feedback loop.

In at least some examples, the data feedback loop is configured to sample (slice) an input data stream combined with equalization values based on a first clock signal. The output sample for the data feedback loop determines the equalization value that is combined with the input data stream before a subsequent sampling by the data feedback loop occurs. In some examples, a sign (+ or −) for the equalization value used in the data feedback loop is determined by a data feedback loop output sample's sign (e.g., if the output sample has a positive sign, the equalization value has a negative sign and vice versa). Meanwhile, a magnitude of the equalization value is selected to compensate for channel effects. In some examples, equalization value magnitudes related to the data feedback loop are predetermined values based on previous measurements or estimates of channel effects. In other examples, equalization value magnitudes related to the data feedback loop are dynamically determined by monitoring channel behavior and adjusting an equalization value magnitude accordingly.

In contrast to the data feedback loop, the edge feedback loop is configured to sample (slice) an input data stream combined with equalization values based on a second clock signal that is different than the first clock signal. The second clock signal is phase-shifted relative to the first clock signal by ¼ of the data period, or unit interval. An output sample for the edge feedback loop determines the equalization value that is combined with the input data stream before a subsequent sampling by the edge feedback loop occurs. In some examples, a sign (+ or −) for the equalization value applied in the edge feedback loop is determined by an edge feedback loop output sample's sign (e.g., if the output sample has a positive sign, the equalization value has a negative sign and vice versa). Meanwhile, a magnitude of the equalization value is selected to compensate for channel effects. In some examples, equalization value magnitudes related to the edge feedback loop are predetermined values based on measurements or estimates of channel effects. In other examples, equalization value magnitudes related to the edge feedback loop are dynamically determined by monitoring channel behavior.

In accordance with various examples, a receiver module includes a DFE circuit with independent data feedback and edge feedback loops as described herein. The receiver module also includes a clock recovery circuit that uses output samples from the data feedback loop and the edge feedback loop to determine a phase error in a receiver clock signal relative to a target clock signal (e.g., the clock signal used to transmit the input data stream). In some examples, at least two output samples from the data feedback loop and at least one sample from the edge feedback loop are used by the clock recovery circuit to determine a phase error. The determined phase error is used to adjust a receiver clock signal. A receiver module with one or more DFE circuits, as described herein, repeats the process of receiving an input data stream, applying equalization values to the input data stream, correcting a receiver clock signal based on output samples from a data feedback loop and a separate edge feedback loop. In some examples, a receiver module with one or more DFE circuits, as described herein, includes other components such as a linear equalizer, phase-locked loop (PLL) components, retimer components, serializer/deserializer components, a multi-phase clock generator, voltage regulators, signal detect components, eye opening monitors, pattern generators, multiplexers, drivers, and/or other components. To provide a better understanding, various receiver module and DFE options are described using the figures as follows.

FIG. 1 shows a block diagram of a system 100 with a DFE circuit 112 in accordance with various examples. As shown, the system 100 includes a transmitter 104, a channel 106, and a receiver 110, where the receiver 110 employs the DFE circuit 112 to perform equalization operations, which facilitate recovery of source data 102 transmitted by the transmitter 104 via the channel 106. The channel 106 represents one or more physical transmission mediums (e.g., wires, air, optical fiber, etc.) used to convey signals between the transmitter 104 and the receiver 110. In operation, the transmitter 104 receives the source data 102 and conveys a signal representing the source data 102 to the channel 106. The receiver 110 operates to receive signals from the channel 106 and to recover the source data 102. As desired, the receiver 110 stores recovered data locally and/or passes recovered data to another communication link.

Figure 2:
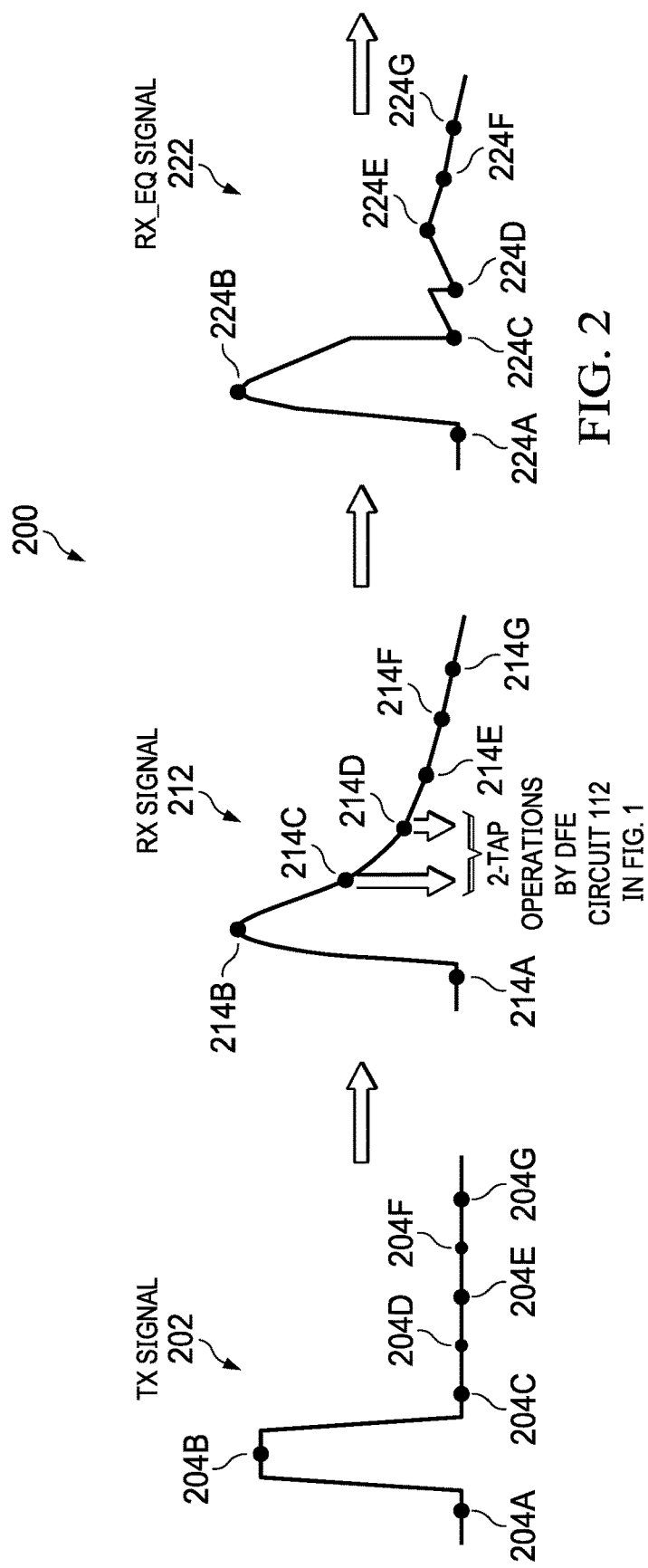
FIG. 2 an illustration of transmitter-side and receiver-side signals in accordance with various examples.

Recovering the source data 102 at the receiver 110 involves various operations, including those performed by the DFE circuit 112. FIG. 2 provides a representation of how a transmitted signal is affected by the channel 106 and how the operation of the DFE circuit 112 affects a received signal. In FIG. 2, a transmitter-side signal 202 and receiver-side signals 212 and 222 are represented. As shown, the transmitter-side signal 202 includes a single pulse such that sampling of the transmitter-side signal 202 at a given rate results in one sample 204B having a high-bit value (a logical "one") and the other samples 204A and 204C-204G having low-bit values (a logical "zero"). Meanwhile, the receiver-side signal 212 represents the transmitter-side signal 202 after it has passed through the channel 106. As shown, the receiver-side signal 212 is spread compared to the transmitter-side signal 202, such that samples 214A-214G of the receiver-side signal 212 (assume the sampling rates for the transmitter-side signal 202 and the receiver-side signal 212 are the same) have various values. More specifically, the sample 214A has a low-bit value, the sample 214B has a high-bit value, the samples 214C-214F have intermediate values, and the sample 214G has low-bit value.

The operation of the DFE circuit 112 is to briefly delay and modify receiver-side signals such as the receiver-side signal 212, resulting in "equalized" receiver-side signals such as the equalized receiver-side signal 222. Compared to the samples 212A-212G of the receiver-side signal 212, the samples 224A-224G of the equalized receiver-side signal 222 (assume the sampling rates for the transmitter-side signal 202 and the equalized receiver-side signal 222 are the same) more closely resemble the samples 202A-202G of the transmitter-side signal 202.

In FIG. 2, the equalized receiver-side signal 222 is obtained by performing a 2-tap DFE operation on the receiver-side signal 212. More specifically, the 2-tap DFE operation changes the intermediate values of samples 214C and 214D in the receiver-side signal 212 to low-bit values 224C and 224D in the equalized receiver-side signal 222. Compared to receiver-side signal 212, the equalized receiver-side signal 222 has a shape that more closely resembles the transmitter-side signal 202 and enables higher-speed signaling by reducing intersymbol interference (ISI). In different examples, the DFE operations performed by the DFE circuit 112 varies. In some examples, the DFE circuit 112 performs a 1-tap DFE operation (e.g., changing the value of sample 214C to sample 224C). In other examples, the DFE circuit 112 performs a two-tap DFE operation as represented in FIG. 2 or other multi-tap DFE operations (e.g., 3 or more taps). Also, in different examples, DFE operations of the DFE circuit 112 vary with regard to the equalization values applied to signal samples. In general, DFE operations attempt to account for the effect of a channel (e.g., the channel 106) by reducing the magnitude of one or more receiver-side signal samples (positive or negative) immediately following a sample with a high-bit value (positive or negative). For optimal results, DFE operations depend on ongoing and accurate clock recovery operations in a receiver such as the receiver 110 of FIG. 1.

Returning to FIG. 1, the DFE circuit 112 operates on an input signal (V_IN), which is provided by a continuous time linear equalizer (CTLE) 114 coupled to the DFE circuit 112. In different examples, V_IN is an amplified and/or cleaner signal relative to the signal provided by the channel 106. The DFE circuit 112 also couples to a clock recovery circuit 116 to enable adjustments to the frequency and/or the phase of receiver-side clock signals (CLK1 and CLK2). More specifically, in some examples, the clock recovery circuit 116 includes a phase-locked loop (PLL) 118 with a phase detector 120, a loop filter 122, and a voltage-controlled oscillator (VCO) 124. The phase detector 120 uses output samples from the DFE circuit 112 to determine a phase error. The phase error is conveyed to the loop filter 122, which varies its output voltage based on the phase error. In response to voltage adjustments output from the loop filter 122, the signal frequency output by the VCO 124 changes (the frequency increases or decreases). In at least some examples, the output of the VCO 124 is provided to a multi-phase clock generator 126 that uses the signal from the VCO 124 to generate different receiver clock signals, including CLK1 and CLK2.

As represented in FIG. 1, output samples from the DFE circuit 112 are provided by independent data and edge feedback loops, each employing a different clock signal to sample an input data steam combined with equalization values. More specifically, the DFE circuit 112 includes a data feedback loop 130 with a data slicer 132, equalization selection logic 134, and combiner logic 136. Meanwhile, the edge feedback loop 140 includes a data slicer 142, equalization selection logic 144, and combiner logic 146. In some examples, the data slicer 132, equalization selection logic 134, and combiner logic 136 are arranged in a direct feedback topology for the data feedback loop 130. In other examples, the data slicer 132, equalization selection logic 134, and combiner logic 136 are arranged in a loop unrolled topology for the data feedback loop 130. Similarly, in some examples, the data slicer 142, equalization selection logic 144, and combiner logic 146 are arranged in a direct feedback topology for the edge feedback loop 140. In other examples, the data slicer 142, equalization selection logic 144, and combiner logic 146 are arranged in a loop unrolled topology for the edge feedback loop 140.

Regardless of the particular topology used for the data feedback loop 130, it samples an input data stream combined with equalization values using CLK1 and provides output samples (V_DATA) that correspond to data samples when a receiver clock is aligned properly with a transmitter clock. Likewise, regardless of the particular topology used for the edge feedback loop 140, it samples an input data stream combined with equalization values using CLK2 (different than CLK1) and provides output samples (V_EDGE) that correspond to edge samples when a receiver clock signal is aligned properly with a transmitter clock signal. More accurately, the receiver clock signal is not always aligned with the transmitter clock signal (due to variations in the receiver clock signal and/or the transmitter clock signal). To account for this ongoing issue, the receiver clock signal is adjusted so that V_EDGE switches back and forth between a high-bit value and a low-bit value (tracking the edge in a controlled manner).

In at least some examples, the phase detector 120 uses two V_DATA samples and one V_EDGE sample to determine a phase error (is sampling occurring early or late relative to a target clock signal). This process is repeated, and results in V_DATA samples from the data feedback loop 130 that correspond to an equalized receiver-side signal (e.g., signal 222 in FIG. 2). In FIG. 1, the V_DATA samples are provided to block 128, which corresponds to retimer components and/or other receiver components (e.g., deserializer components). The output of block 128 is a signal 129 that corresponds to a modified version of the source data 102 (e.g., different clock rate, deserialized, etc.) that is provided to other components outside receiver 110 for further conveyance, processing, storage, or use.

Figure 3:
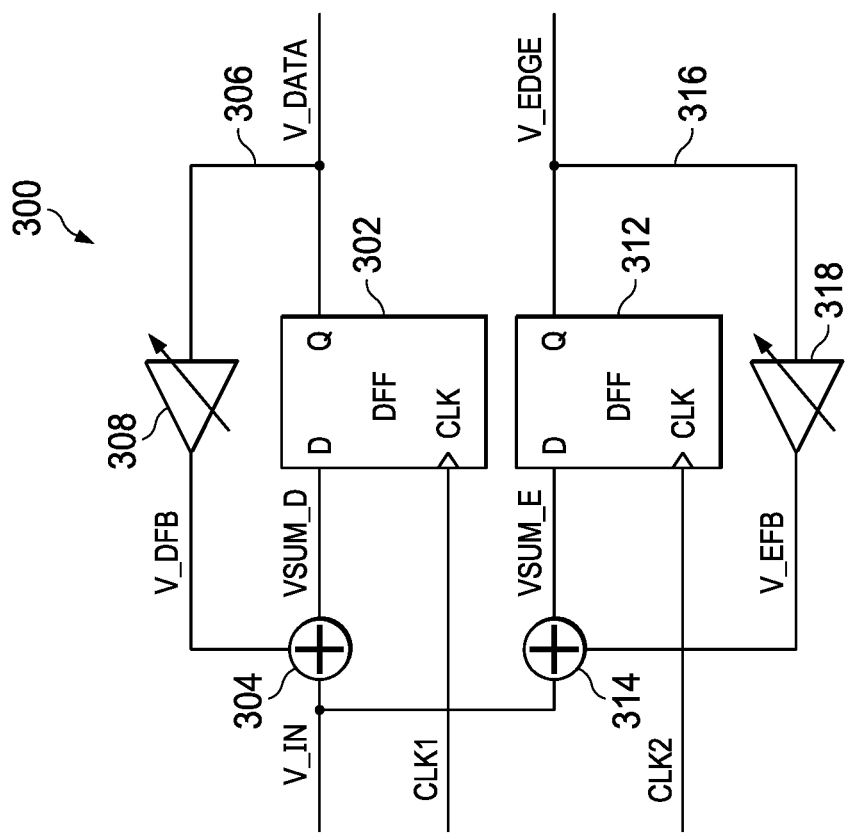
FIG. 3 shows a DFE circuit with a direct feedback topology in accordance with various examples.

FIG. 3 shows a DFE circuit 300 with a direct feedback topology in accordance with various examples. In at least some examples, the DFE circuit 300 corresponds to the DFE circuit 112 of FIG. 1. As shown in FIG. 3, the DFE circuit 300 comprises a first flip-flop 302 with its input configured to receive the output of a first summation circuit 304. The output of the first flip-flop 302 couples to the first summation circuit 304 via a data feedback path 306 with first equalization selection logic 308. The arrangement of the first flip-flop 302, the first summation circuit 304, the data feedback path 306, and the first equalization selection logic 308 in FIG. 3 is an example of the data feedback loop 130 of FIG. 1. More specifically, the first flip-flop 302 is an example of the data slicer 132 of FIG. 1, the first equalization selection logic 308 is an example of the equalization selection logic 134 in FIG. 1, and the first summation circuit 304 is an example of the combiner logic 136 in FIG. 1.

In operation, the first summation circuit 304 combines the input data stream, V_IN, with equalization values (V_DFB) selected in the data feedback path 306 by the first equalization selection logic 308. The first flip-flop 302 samples the combination of V_IN and V_DFB (the combination is labeled VSUM_D) at a rate determined by CLK1. Output samples of the first flip-flop 302 correspond to V_DATA values which are fed into the data feedback path 306 and are used by the first equalization selection logic 308 to select each equalization value, V_DFB. In at least some examples, the first equalization selection logic 308 uses the magnitude and sign (+ or −) of each V_DATA value to select each V_DFB value. In one example, if a V_DATA value is positive and has less magnitude than a previous positive V_DATA value, the first equalization selection logic 308 provides a negative V_DFB value to the first summation circuit 304. Also, if a V_DATA value is negative and has less magnitude than a previous negative V_DATA value, the first equalization selection logic 308 provides a positive V_DFB value to the first summation circuit 304. In different examples, the magnitude of V_DFB values varies to account for different channels.

As shown in FIG. 3, the DFE circuit 300 also comprises a second flip-flop 312 with its input configured to receive the output of a second summation circuit 314. The output of the first flip-flop 312 couples to the second summation circuit 314 via an edge feedback path 316 with second equalization selection logic 318. The arrangement of the second flip-flop 312, the second summation circuit 314, the edge feedback path 316, and the second equalization selection logic 318 in FIG. 3 is an example of the edge feedback loop 140 of FIG. 1. More specifically, the second flip-flop 312 is an example of the data slicer 142 of FIG. 1, the second equalization selection logic 318 is an example of the equalization selection logic 144 in FIG. 1, and the second summation circuit 314 is an example of the combiner logic 146 in FIG. 1.

In operation, the second summation circuit 314 combines the input data stream, V_IN, with equalization values (V_EFB) selected in the edge feedback path 316 by the second equalization selection logic 318. The second flip-flop 312 samples the combination of V_IN and V_EFB (the combination is labeled VSUM_E) at a rate determined by CLK2, which is different than CLK1. Output samples of the second flip-flop 312 correspond to V_EDGE values which are fed into the edge feedback path 316 and are used by the second equalization selection logic 318 to select each equalization value, V_EFB. In at least some examples, the second equalization selection logic 318 uses the magnitude and sign (+ or −) of each V_EDGE value to select each V_EFB value. In one example, if a V_EDGE value is positive and has less magnitude than a previous positive V_EDGE value, the second equalization selection logic 318 provides a negative V_EFB value to the second summation circuit 314. Also, if a V_EDGE value is negative and has less magnitude than a previous negative V_EDGE value, the second equalization selection logic 318 provides a positive V_EFB value to the second summation circuit 314. In different examples, the magnitude of V_EFB values varies to account for different channels (e.g., channel 106).

Figure 4A:
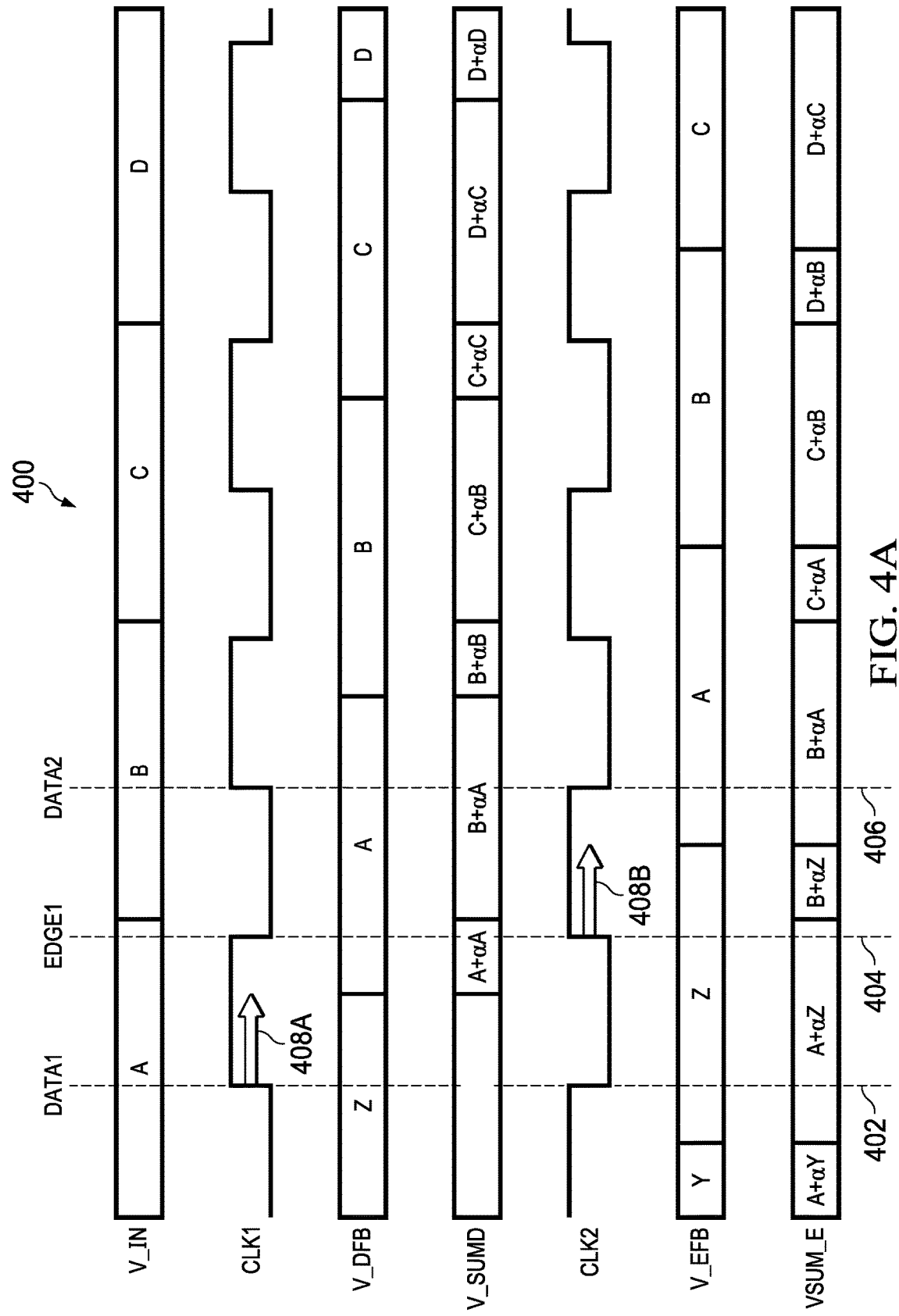
FIGS. 4A and 4B show sample values and clock signal timing scenarios related to the DFE circuit of FIG. 3 in accordance with various examples.
Figure 4B:
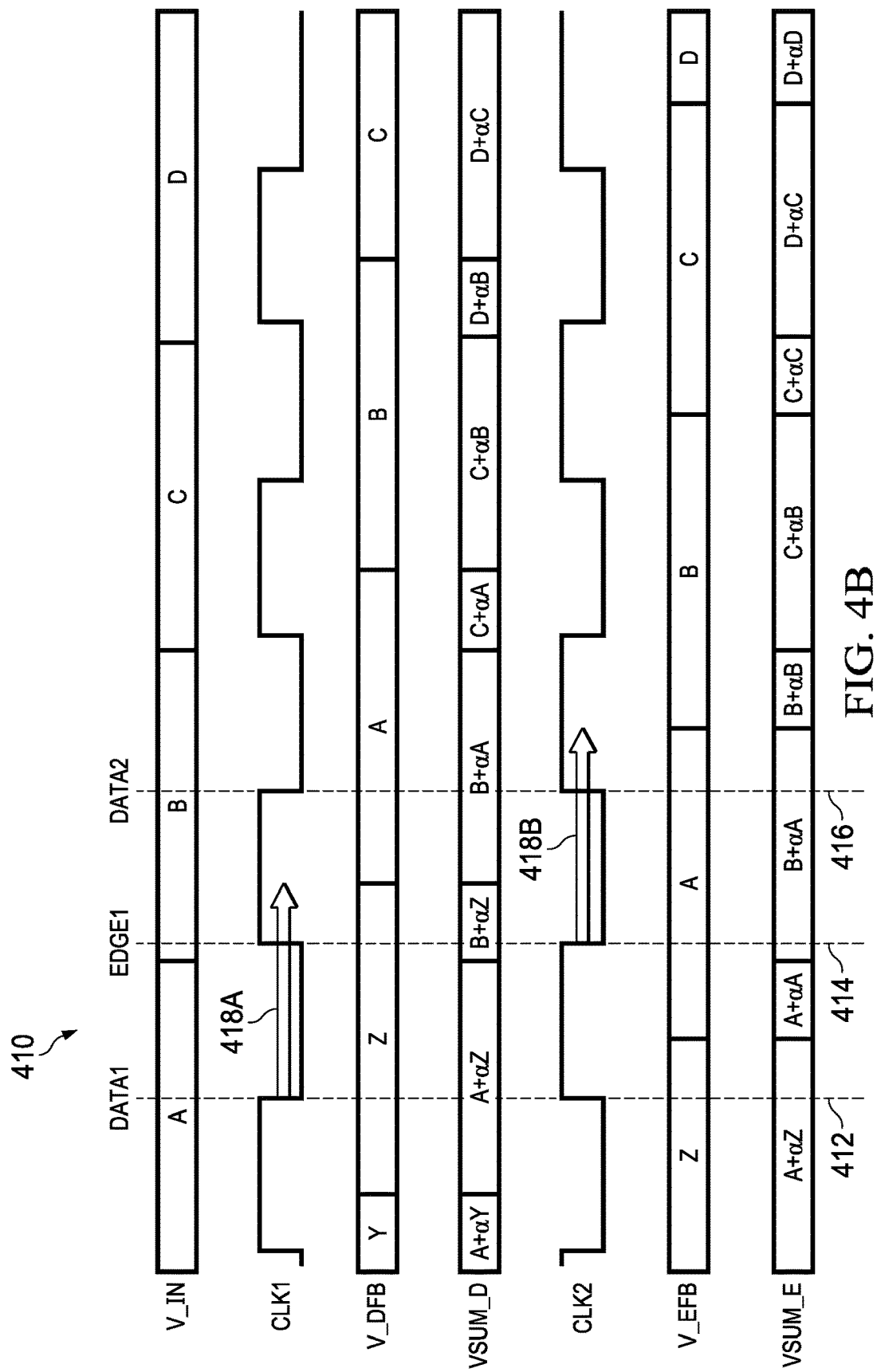

FIGS. 4A and 4B show sample values and clock signal timing scenarios 400 and 410 related to the DFE circuit 300 of FIG. 3 in accordance with various examples. In scenarios 400 and 410, various sample values and clock signals are represented as a function of time. More specifically, scenario 400 shows example values for V_IN, CLK1, V_DFB, VSUM_D, CLK2, V_EFB, and VSUM_E. For scenario 400, a feedback delay that is less than 0.5 unit internals (UIs) is assumed as represented by block arrows 408A and 408B, which have a length that is less than half the period of CLK1. In some examples, the value of UI is determined by a target clock signal or a predetermined clock signal. As shown, V_IN is represented as having four values A, B, C, D, each available to be sampled for a limited amount of time (e.g., A, B, C, D are sequential data stream values or symbols). CLK1 is a clock signal with a period represented as having the same length as the duration of each V_IN value. V_DFB is a delayed version of V_IN. V_SUM_D combines the values of V_IN with an equalizer value ($\alpha$A, $\alpha$B, $\alpha$C, $\alpha$D), resulting in combination values such as A+$\alpha$A, B+$\alpha$A, B+$\alpha$B, C+$\alpha$B, C+$\alpha$C, D+$\alpha$C, D+$\alpha$D. CLK2 is a shifted version of CLK1 (shifted by 180 degrees). V_EFB is a delayed version V_IN, where the delay for V_EFB is longer than the delay for V_DFB. V_SUM_E combines the values of V_IN with an equalizer value ($\alpha$Y, $\alpha$Z, $\alpha$A, $\alpha$B), resulting in combination values such as A+$\alpha$Y, A+$\alpha$Z, B+$\alpha$Z, B+$\alpha$A, C+$\alpha$A, C+$\alpha$B, D+$\alpha$B, D+$\alpha$C.

Meanwhile, for scenario 410 of FIG. 4B, the same sample values and clock signals discussed for scenario 400 of FIG. 4A are represented (some shifted). For scenario 410 of FIG. 4B, a feedback delay that is greater than 0.5 UI is assumed as represented by block arrows 418A and 418B having a length that is greater than half the period of CLK1. For scenario 410, the delay of V_DFB relative to V_IN is greater than the delay of V_EFB relative to V_IN. Table 1 below shows a summary of output values related to sampling times 402, 404, 406 represented in the scenario 400 of FIG. 4A, and sampling times 412, 414, and 416 represented in the scenario 410 of FIG. 4B.

TABLE 1

| Feedback Delay | Clock Alignment | Data 1 | Edge 1 | Data 2 |
|---|---|---|---|---|
| 0.5 UI | Early | A + $\alpha$Z | A + $\alpha$Z/B + $\alpha$A | B + $\alpha$A |
| 0.5 UI | Late | A + $\alpha$Z | A + $\alpha$Z/B + $\alpha$A | B + $\alpha$A |
| >0.5 UI | Early | A + $\alpha$Z | A + $\alpha$Z | B + $\alpha$A |

TABLE 1-continued

| Feedback Delay | Clock Alignment | Data 1 | Edge 1 | Data 2 |
|---|---|---|---|---|
| >0.5 UI | Late | A + $\alpha$Z | B + $\alpha$A | B + $\alpha$A |
| <0.5 UI | Early | A + $\alpha$Z | A + $\alpha$Z | B + $\alpha$A |
| <0.5 UI | Late | A + $\alpha$Z | B + $\alpha$A | B + $\alpha$A |

As shown in Table 1, the output samples represented by Data 1, Edge 1, and Data 2 include an input data stream value (e.g., A or B) combined with a respective equalization values ($\alpha$Z or $\alpha$A). More specifically, sample A should be combined with a weighted version of sample Z (Z is input data stream sample before A and is weighted by $\alpha$), sample B should be combined with a weighted version of sample A (A is input data stream sample before B and is weighted by $\alpha$), and so on.

With independent data and edge feedback loops as described herein, the DFE circuit 300 relaxes the feedback delay requirements for DFE operations compared to DFE arrangements that do not use independent data and feedback loops. For example, in contrast to disclosed DFE circuit examples, a DFE circuit arrangement with a single feedback loop for data and edge sampling outputs invalid edge combination values (e.g., B+$\alpha$Z) when a feedback delay is greater than 0.5 UI and a late clock alignment exists. Likewise, a DFE circuit arrangement with a single feedback loop used for data and edge sampling outputs invalid edge combination values (e.g., A+$\alpha$A) when a feedback delay is less than 0.5 UI and an early clock alignment exists. The disclosed DFE circuit 112 with independent data and edge feedback loops relaxes feedback delay requirements such that a feedback delay less than or greater than 0.5 UI (up to a maximum just below 1.0 UI is possible). In contrast to the disclosed DFE circuit examples, a DFE circuit arrangement with a single feedback loop for data and edge sampling requires stringent feedback delay timing (the feedback delay needs to be 0.5 UI to avoid invalid values).

Figure 5:
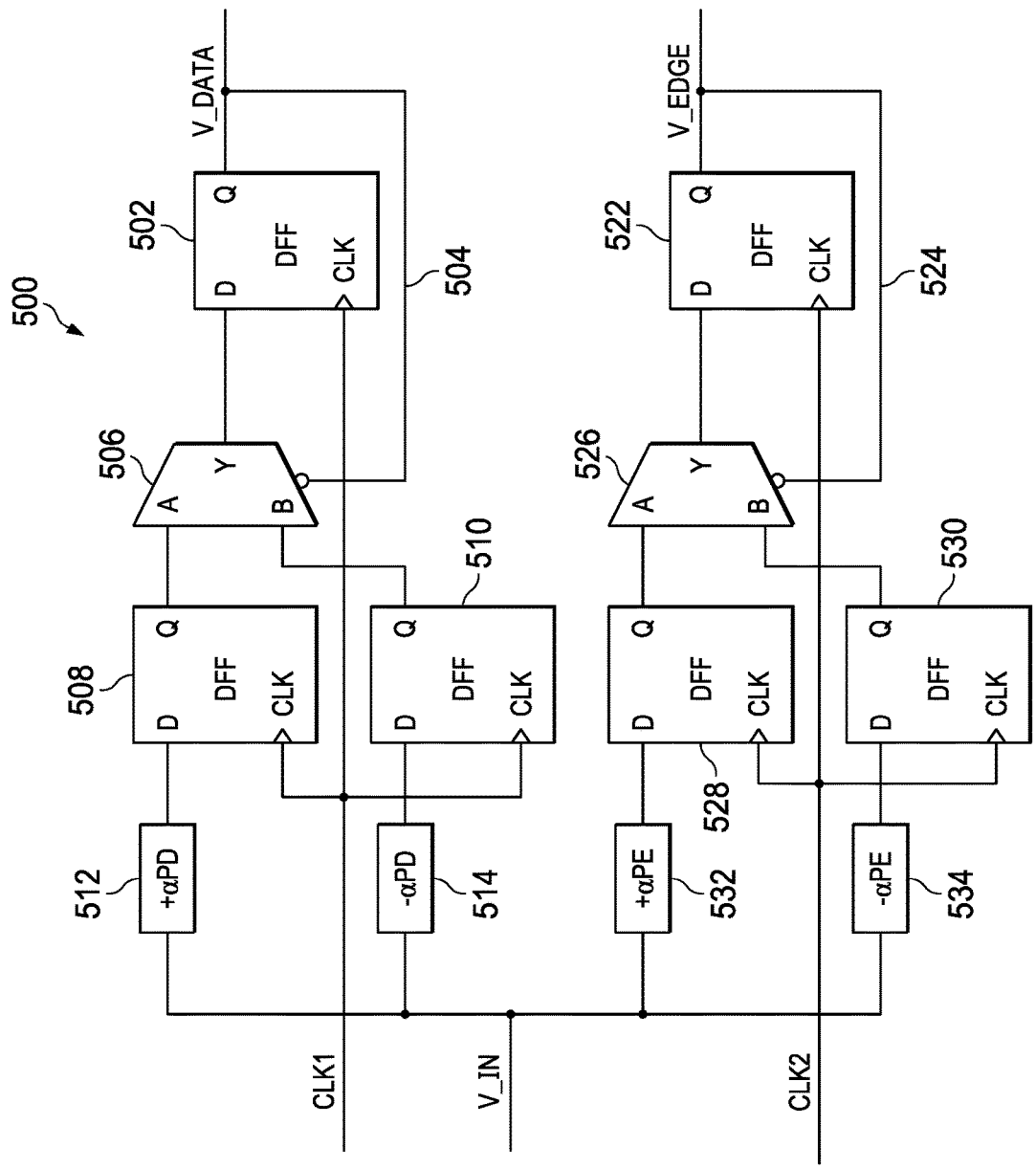
FIG. 5 shows a DFE circuit with a loop unrolled topology in accordance with various examples.

FIG. 5 shows a DFE circuit 500 with a loop unrolled topology in accordance with various examples. In at least some examples, the DFE circuit 500 corresponds to the DFE circuit 112 of FIG. 1. As shown in FIG. 5, the DFE circuit 500 comprises a flip-flop 502 that samples based on CLK1, where the output sample (V_DATA) of the flip-flop 502 is fed into a data feedback path 504 to control multiplexer 506. In some examples, the sign of each V_DATA output sample from the flip-flop 502 is used to select which input to the multiplexer 506 is selected. The inputs to the multiplexer 506 are provided by flip-flops 508 and 510. The flip-flop 508 is configured to sample a first possible data value (V_IN+ $\alpha$PD, where PD is the previous V_DATA sample and +$\alpha$ is an equalization weight) provided by equalization selection block 512. Meanwhile, the flip-flop 510 samples another possible data value (V_IN−$\alpha$PD) provided by equalization selection block 514.

The result of the above-noted arrangement for DFE circuit 500 is that the sign of the data feedback loop output sample (V_DATA) is used to select one of the possible data values provided to the multiplexer 506 (e.g., V_IN+$\alpha$PD or V_IN−$\alpha$PD is selected by multiplexer 506, where PD is the previous V_DATA sample and −$\alpha$ is an equalization weight). For the arrangement represented in DFE circuit 500, if the sign of V_DATA (the output of flip-flop 502) is negative, the output of equalization selection block 512 and flip-flop 508 is selected by the multiplexer 506 as the input for flip-flop 502 (V_IN+$\alpha$PD is selected when V_DATA is negative). Otherwise, if the sign of V_DATA is positive, the output of equalization selection block 514 and flip-flop 510 is selected by the multiplexer 506 as the input for flip-flop 502 (V_IN−αPD is selected when V_DATA is positive). Relating the DFE circuit 500 of FIG. 5 to the DFE circuit 112 of FIG. 1, the flip-flop 502 of FIG. 5 is an example of the data slicer 132 in FIG. 1, the equalization selection blocks 512, 514 and flip-flops 508, 510 are examples of the equalization selection logic 134 in FIG. 1, and the multiplexer 506 is an example of the combiner logic 136 in FIG. 1.

As shown in FIG. 5, the DFE circuit 500 also comprises a flip-flop 522 that samples based on CLK2, where the output sample (V_EDGE) of the flip-flop 522 is fed into an edge feedback path 524 to control multiplexer 526. In some examples, the sign of the output sample from the flip-flop 522 is used to select which input to the multiplexer 526 is selected. The inputs to the multiplexer 526 are provided by flip-flops 528 and 530. The flip-flop 528 is configured to sample a first possible edge value (V_IN+αPE, where PE is the previous V_EDGE sample and +α is an equalization weight) provided by equalization selection block 532. Meanwhile, the flip-flop 530 samples another possible edge value (V_IN−αPE, where PE is the previous V_EDGE sample and −α is an equalization weight) provided by equalization selection block 534. The result of the above-noted arrangement for DFE circuit 500 is that the sign of the edge feedback loop output sample (V_EDGE) is used to select one of the possible edge values provided to the multiplexer 526 (e.g., V_IN+αPE or V_IN−αPE is selected by multiplexer 526). For the arrangement represented in DFE circuit 500, if the sign of V_EDGE (the output of flip-flop 522) is negative, the output of equalization selection block 532 and flip-flop 528 is selected by the multiplexer 526 as the input for flip-flop 522 (V_IN−αPE is selected when V_EDGE is positive). Otherwise, if the sign of V_EDGE is positive, the output of equalization selection block 534 and flip-flop 530 is selected by the multiplexer 526 as the input for flip-flop 522 (V_IN+αPE is selected when V_EDGE is negative). Relating the DFE circuit 500 of FIG. 5 to the DFE circuit 112 of FIG. 1, the flip-flop 522 of FIG. 5 is an example of the data slicer 142 in FIG. 1, the equalization selection blocks 532, 534 and flip-flops 528, 530 are examples of the equalization selection logic 144 in FIG. 1, and the multiplexer 526 is an example of the combiner logic 146 in FIG. 1.

Figure 6:
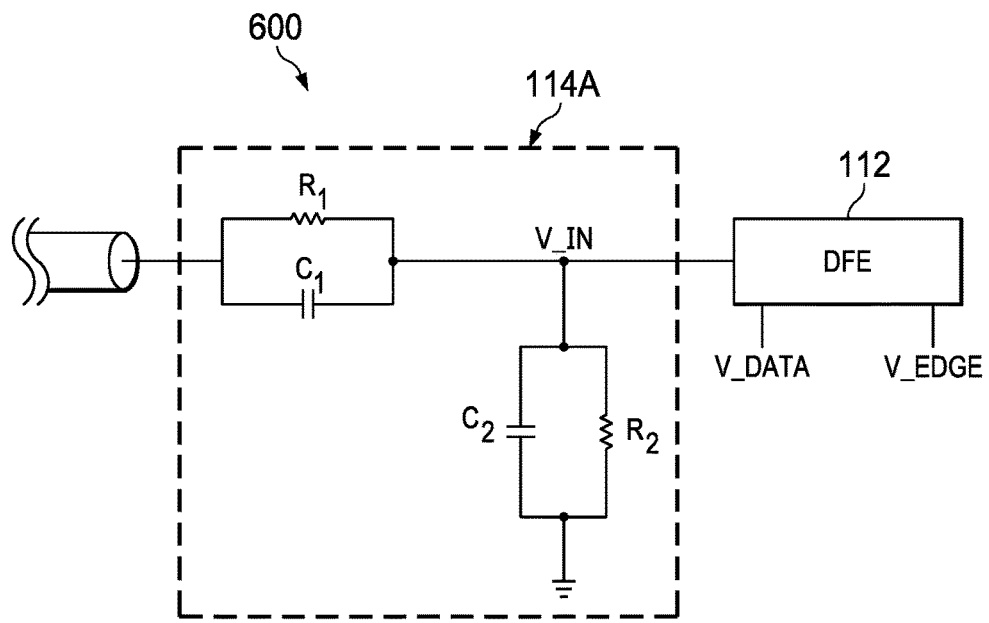
FIG. 6 shows a receiver module equalization option in accordance with various examples.

FIG. 6 shows a receiver module equalization option 600 in accordance with various examples. As shown, the receiver module equalization option 600 includes CTLE 114A, which is an example of the CTLE 114 in FIG. 1. The CTLE 114A is a passive CTLE circuit that filters an input signal from a channel (e.g., channel 106) to provide V_IN to DFE circuit 112. In different examples, the DFE circuit 112 of FIG. 6 has a direct feedback topology (see e.g., the DFE circuit 300 FIG. 3) or a loop unrolled topology (see e.g., the DFE circuit 500 FIG. 5). In different receiver examples (see e.g., receiver 110 of FIG. 1), the components and/or component values for a passive CTLE such as CTLE 114A varies. Also, in some receiver examples, a CTLE such as CTLE 114A is omitted.

Figure 7:
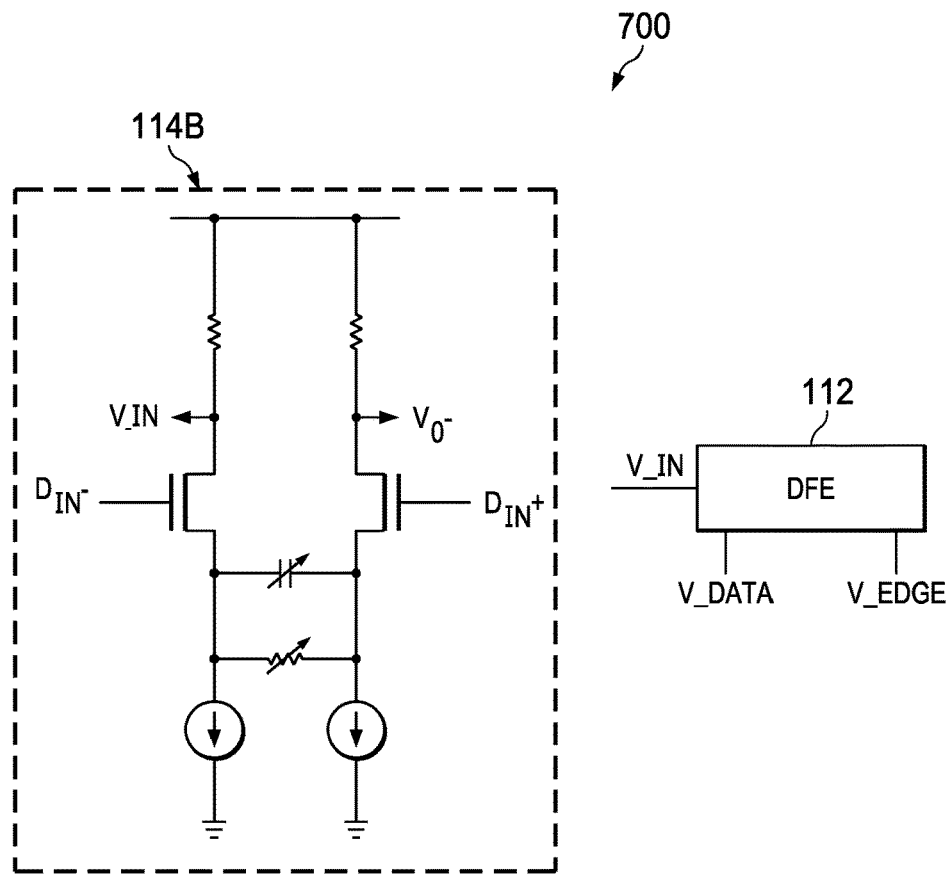
FIG. 7 shows another receiver module equalization option in accordance with various examples.

FIG. 7 shows another receiver module equalization option 700 in accordance with various examples. As shown, the receiver module equalization option 700 includes CTLE 114B, which is an example of the CTLE 114 in FIG. 1. The CTLE 114B is an active CTLE circuit that amplifies an input signal from a channel (e.g., channel 106) to provide V_IN to DFE circuit 112. In different examples, the DFE circuit 112 of FIG. 7 has a direct feedback topology (see e.g., the DFE circuit 300 FIG. 3) or a loop unrolled topology (see e.g., the DFE circuit 500 FIG. 5). In different receiver examples (see e.g., receiver 110 of FIG. 1), the components and/or component values for CTLE 1146 varies. Also, in some receiver examples, a CTLE such as CTLE 1146 is omitted.

Figure 8:
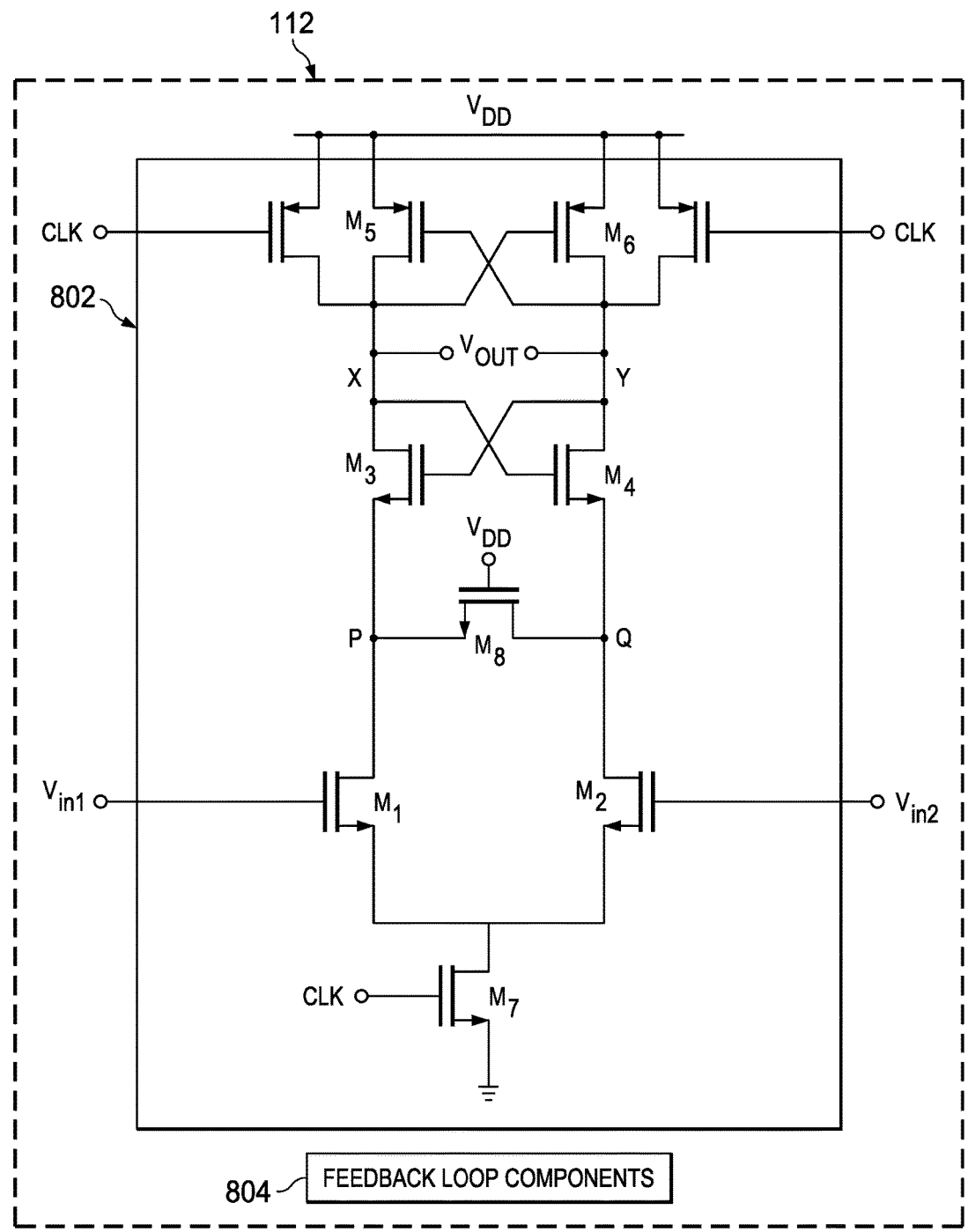
FIG. 8 shows a data slicer option for a DFE circuit in accordance with various examples.

FIG. 8 shows a data slicer option for a DFE circuit (e.g., DFE circuit 112 in FIG. 1) in accordance with various examples. In FIG. 8, the DFE circuit 112 includes a data slicer 802 with a StrongARM latch topology. In different examples, the data slicer 802 is coupled to feedback loop components 804 included with the DFE circuit 112 (e.g., the data slicer 802 is an example of data slicers 132 and 142 in FIG. 1, flip-flops 302 and 312 in FIG. 3, and/or flip-flops 502, 522, 508, 510, 528, and 530 in FIG. 5). In different examples, the components and/or component values used StrongARM latch topology represented for the data slicer 802 varies. In some examples, the data slicer 802 employs a modified StrongARM latch topology (e.g., the number or arrangement of precharge switches varies). Also, in some examples, a cross-coupled NAND topology is added to a StrongARM latch topology or modified StrongARM latch topology to form a D flip-flop. In other examples, DFE circuits such as the DFE circuit 112 employ other data slicer topologies.

Figure 9:
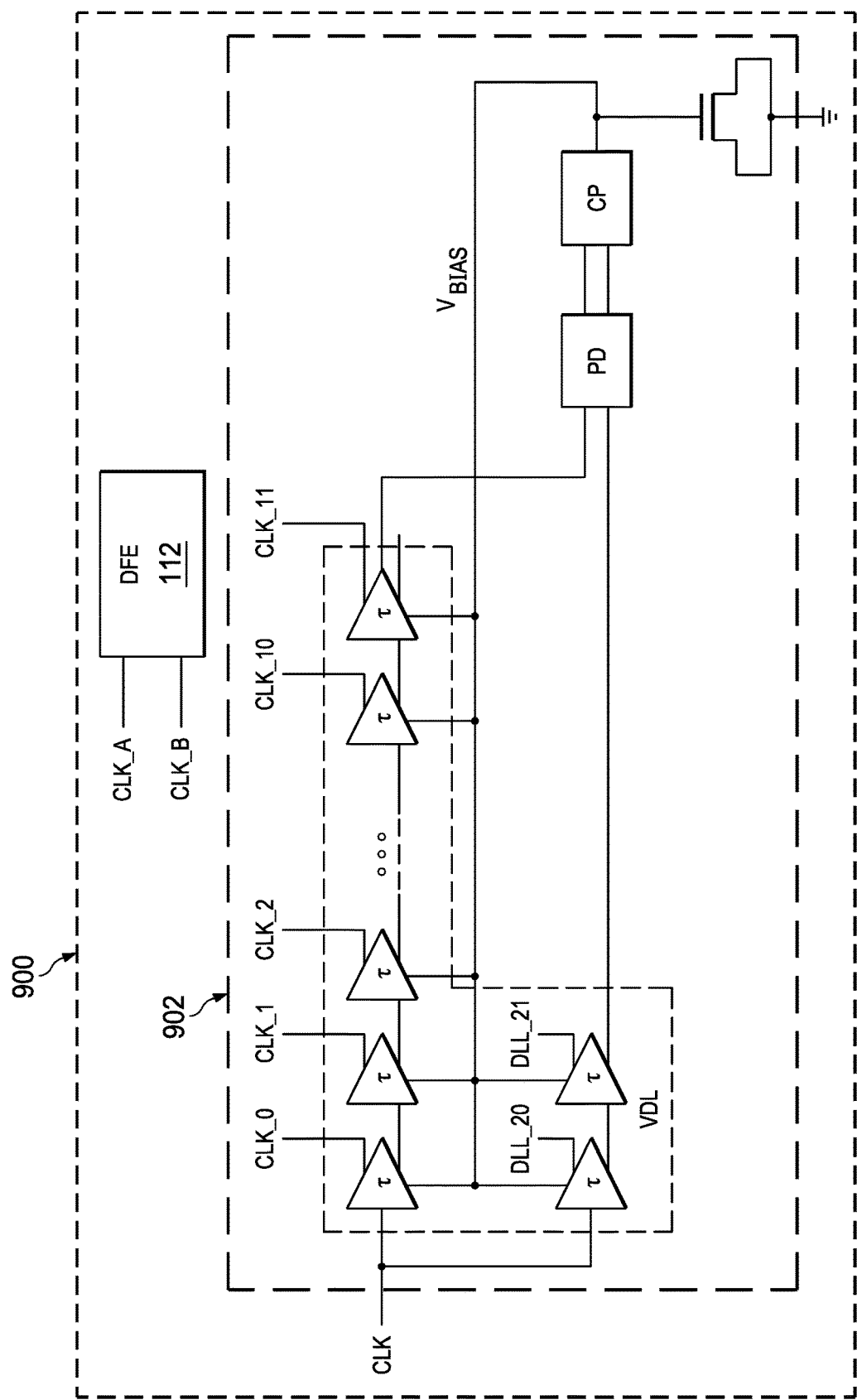
FIG. 9 shows a receiver clock generation topology for a receiver with a DFE circuit in accordance with various examples.

FIG. 9 shows a multi-phase clock generator topology 902 for a receiver 900 with DFE circuit 112 in accordance with various examples. In FIG. 9, the receiver 900 is an example of receiver 110 of FIG. 1 and the multi-phase clock generator topology 902 is an example topology for the multi-phase clock generator 126 represented in FIG. 1. As shown, the multi-phase clock generation topology 902 involves delay circuits (each labeled "τ") to receive an input clock signal (CLK) and to generate delayed versions of CLK (CLK_0–CLK_11 have different phases relative to CLK and each other). In operation, the different clock phases are monitored by a phase detector (PD) and a charge pump (CP) is used to bias the delay circuits. The receiver 900 in FIG. 9 includes the DFE circuit 112 represented in FIG. 1, where the DFE circuit 112 receives CLK_A and CLK_B as inputs for the different feedback loops, where CLK_A and CLK_B corresponds to two of the different clock signals (CLK_0–CLK_11) generated by the multi-phase clock generation topology 902. In some examples, CLK_A and CLK_B for receiver 900 are phase offset from each other by 180 degrees and are controlled to have same frequency as a target clock signal (e.g., a transmitter clock signal). In some examples, CLK_A and CLK_B for receiver 900 are phase offset from each other by 90 degrees and are controlled to have half the frequency of a target clock signal (e.g., a transmitter clock signal).

Figure 10:
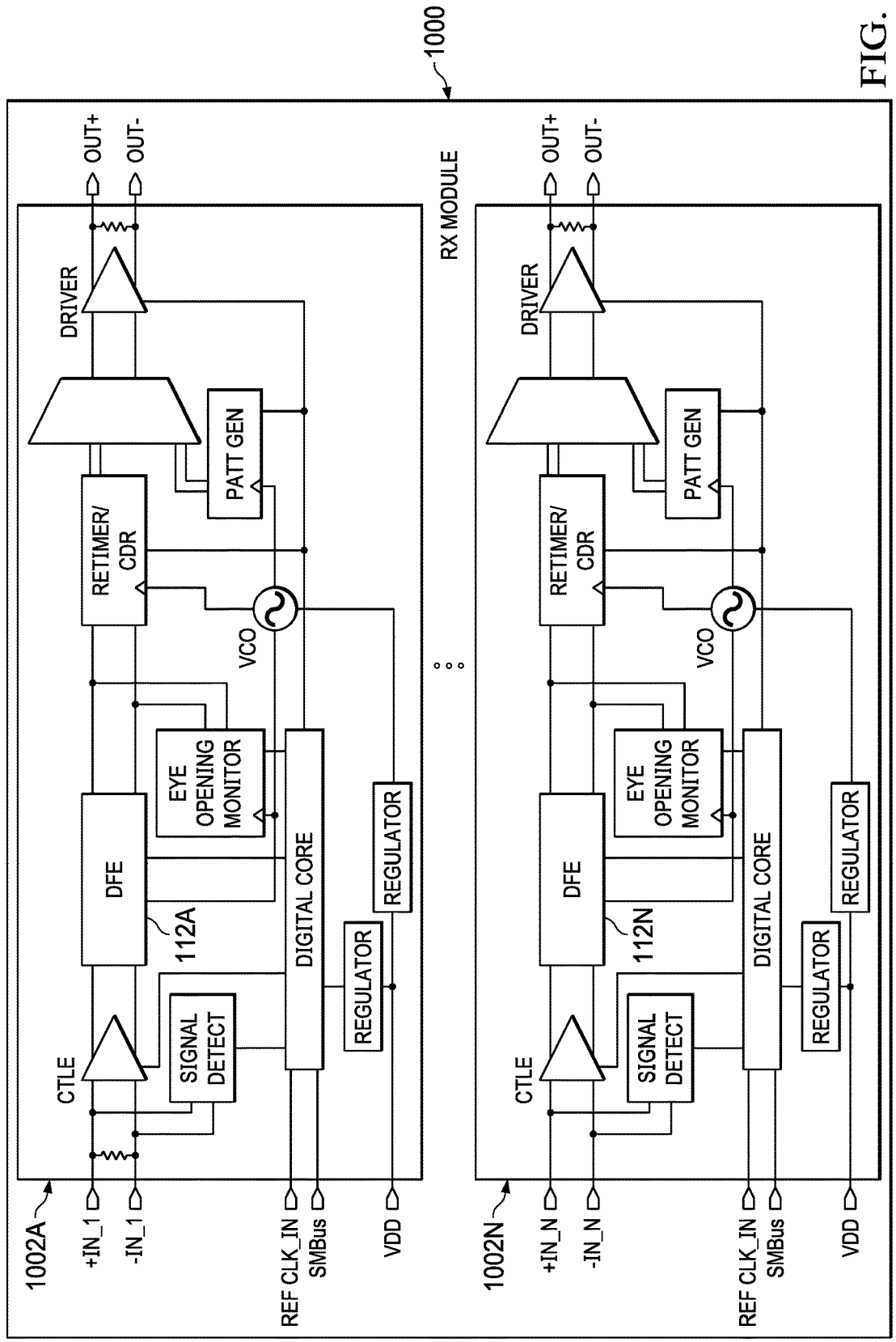
FIG. 10 shows a receiver module in accordance with various examples.

FIG. 10 shows a receiver module 1000 in accordance with various examples. The receiver module 1000 represents one or more integrated circuits and/or components coupled together using a printed circuit board (PCB). As shown, the receiver module 1000 includes sets of receiver components 1002A-1002N for each of a plurality of communication channels, each of the sets of receiver components 1002A-1002N includes a respective DFE circuit 112A-112N. Each of the DFE circuits 112A-112N represented for the receiver module 1000 is an example of the DFE circuit 112 described in FIG. 1. In different examples, each of the DFE circuits 112A-112N for the receiver module 1000 uses a direct feedback topology for each data and edge feedback loop (see e.g., the DFE circuit 300 of FIG. 3) or a loop unrolled topology for each data and edge feedback loop (see e.g., the DFE circuit 500 of FIG. 5). It is also possible to mix direct feedback and loop unrolled topologies (e.g., by using a direct feedback topology for a data feedback loop and a loop unrolled topology for an edge feedback loop or vice versa).

Besides the DFE circuits 112A-112N, the receiver module 1000 includes other components mentioned or not mentioned previously. Example components for the receiver module 1000 include a CTLE (e.g., CTLE 114), signal detect logic, a digital core, voltage regulators, an eye-opening monitor, a VCO (e.g., VCO 124), a pattern generator, a retimer/CDR (e.g., CDR 116), a multiplexer, and a output signal driver. In some examples, such components are included for each communication channel as shown in FIG. 9. In other examples, more or less components are used in the receiver module 1000 depending on the functionality desired.

In at least some examples, a receiver module such as the receiver module 1000 of FIG. 10 includes a clock recovery circuit and a DFE circuit (e.g., DFE circuit 112 in FIG. 1) that includes a data feedback loop (e.g., the data feedback loop 130) configured to sample an input data stream combined with equalization values (VSUM_D in FIG. 3 or a comparable loop unrolled combination signal) based on a first clock signal (e.g., CLK1). The DFE circuit for a receiver module also includes an edge feedback loop (e.g., the edge feedback loop 140) configured to sample the input data stream combined with equalization values (VSUM_E in FIG. 3 or a comparable loop unrolled combination signal) based on a second clock signal (e.g., CLK2) that is different than the first clock signal. The clock recovery circuit for a receiver module is configured to determine a phase error between a receiver clock signal and a target clock signal based on output samples from the data feedback loop and the edge feedback loop.

In some examples, each feedback loop of a DFE circuit in a receiver module (e.g., the receiver module 1000 of FIG. 10 or another receiver module) comprises a direct feedback topology with an independent summation circuit (e.g., summation circuits 304 and 314 in FIG. 3). More specifically, each feedback loop further comprises a data slicer (e.g., data slicers 132 or 142 in FIG. 1), and a feedback path (e.g., feedback paths 306, 316 in FIG. 3) between an output sample of the data slicer and the independent summation circuit, wherein the feedback path includes equalization selection logic (e.g., equalization selection logic 134 or 144 in FIG. 1) configured to provide an equalization value to the independent summation circuit based at least in part on an output sample's sign.

In some examples, each feedback loop of a DFE circuit in a receiver module (e.g., the receiver module 1000 of FIG. 10 or another receiver module) comprises a loop unrolled topology. In some examples, a loop unrolled topology comprises a data slicer (e.g., data slicers 502 and 522 in FIG. 5), a multiplexer (e.g., multiplexers 506 and 526 in FIG. 5), and a feedback path (e.g., feedback paths 504 and 524 in FIG. 5) between an output sample of the data slicer and a control node of the multiplexer, wherein the multiplexer is configured to select either an input data stream combined with a positive equalization value or an input data stream combined with a negative equalization value (e.g., V_IN+ αPD or V_IN−αPD is selected by multiplexer 506 in FIG. 5) in response to a control signal applied to the control node, and wherein the control signal is adjusted based on an output sample's sign.

In some examples, the clock recovery circuit (e.g., CDR 116) of a receiver module (e.g., the receiver module 1000 of FIG. 10 or another receiver module) is configured to use at least two output samples from the data feedback loop (at least two V_DATA samples) and at least one output sample from the edge feedback loop (at least one V_EDGE sample) to determine the phase error. Also, in some examples, the clock recovery circuit comprises a loop filter (e.g., the loop filter 122 in FIG. 1) coupled to a VCO (e.g., the VCO 124 in FIG. 1), wherein the loop filter adjusts a voltage level applied to the VCO based on the identified clock phase error.

In some examples, a receiver module (e.g., the receiver module 1000 of FIG. 10 or another receiver module) comprises a multi-phase clock generator (e.g., MPCG 126 in FIG. 1) configured to receive an output of the VCO and to generate the first and second clock signals (e.g., CLK1 and CLK2). In some examples, a receiver module (e.g., the receiver module 1000 of FIG. 10 or another receiver module) employs a first clock signal and a second clock signal (e.g., CLK1 and CLK 2) that are full-rate signals relative to an input data stream (e.g., V_IN), and are offset in phase from each other by 180 degrees. In some examples, a receiver module (e.g., the receiver module 1000 of FIG. 10 or another receiver module) employs a first clock signal and the second clock signal (e.g., CLK1 and CLK 2) that are half-rate signals relative to a input data stream (e.g., V_IN), and are offset in phase from each other by 90 degrees. In some examples, a receiver module (e.g., the receiver module 1000 of FIG. 10 or another receiver module) employs one or more DFE circuits, each with a feedback timing greater than 0.5 unit intervals and less than 1.0 unit intervals. In some examples, a receiver module (e.g., the receiver module 1000 of FIG. 10 or another receiver module) employs one or more DFE circuits, each with a feedback timing less than 0.5 unit intervals.

Figure 11:
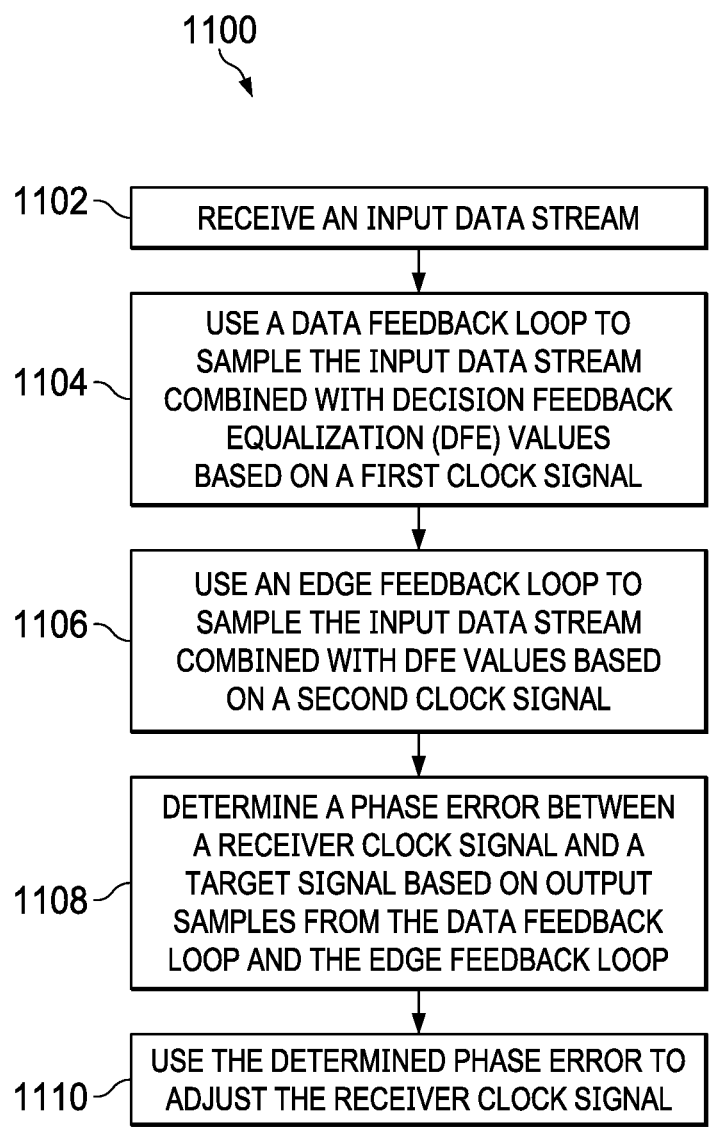
FIG. 11 shows a flowchart of a method in accordance with various examples.

FIG. 11 shows a flowchart of a method 1100 in accordance with various examples. As shown, the method 1100 comprises receiving an input data stream (e.g., V_IN) at block 1102. At block 1104, a data feedback loop (e.g., data feedback loop 130 in FIG. 1) is used to sample the input data stream combined with DFE values (VSUM_D in FIG. 3 or a comparable loop unrolled combination signal) based on a first clock signal (e.g., CLK1). At block 806, an edge feedback loop (e.g., edge feedback loop 140 in FIG. 1) is used to sample the input data stream combined with DFE values (VSUM_E in FIG. 3 or a comparable loop unrolled combination signal) based on a second clock signal (e.g., CLK2). At block 1108, a phase error between a receiver clock signal and a target clock signal is determined based on output samples from the data feedback loop and the edge feedback loop. At block 1110, the determined phase error is used to adjust the receiver clock signal.

In some examples, the method 1100 comprises combining the input data stream with DFE values within a feedback path for the data feedback loop, and separately combining the input data stream with DFE values within a feedback path for the edge feedback loop. In some examples, the method 1100 comprises selecting a DFE value for the data feedback loop based at least in part on an data feedback loop output sample's sign, and selecting a DFE value for the edge feedback loop based at least in part on an edge feedback loop output sample's sign. In some examples, the method 1100 comprises combining the input data stream with positive and negative DFE values to generate first and second combination signals, and using a data feedback loop output sample's sign to select one of the first and second combination signals to sample. Also, in some examples, the method 1100 comprises separately combining the input data stream with positive and negative DFE values to generate third and fourth combination signals, and using an edge feedback loop output sample's sign to select one of the third and fourth combination signals to sample.

In some examples, determining the phase error at block 1108 comprises analyzing at least two output samples from the data feedback loop and at least one output sample from the edge feedback loop. In some examples, the method 1100 comprises generating the first and second clock signals, wherein the first and second signals are full-rate signals relative to the input data stream, and are offset in phase from each other by 180 degrees. In some examples, the method 1100 comprises generating the first and second clock signals, wherein the first and second signals are half-rate signals relative to the input data stream, and are offset in phase from each other by 90 degrees. In some examples, the method 1100 comprises delaying feedback timing for at least one of the data feedback loop and the edge feedback loop by a value between 0.5-1.0 unit intervals. In some examples, the method 1100 comprises delaying feedback timing for at least one of the data feedback loop and the edge feedback loop by a value less than 0.5 unit intervals.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present disclosure. Numerous variations and modifications will become apparent to those skilled in the art once the above disclosure is fully appreciated. For example, it should be appreciated that the DFE circuits with independent data and edge feedback loops are usable in different over-sampled phase detector architectures (e.g., Alexander or Pottbacker). It is intended that the following claims be interpreted to embrace all such variations and modifications.

What is claimed is:

1. A receiver module that comprises:
   a clock recovery circuit; and
   a decision feedback equalizer (DFE) circuit that comprises:
      a data feedback loop configured to sample an input data stream combined with equalization values from a first equalization logic and based on a first clock signal; and
      an edge feedback loop configured to sample the input data stream combined with equalization values from a second equalization logic, the second equalization logic being independent of the first equalization logic and based on a second clock signal that is different than the first clock signal;
   wherein the clock recovery circuit is configured to determine a phase error between a receiver clock signal and a target clock signal based on output samples from the data feedback loop and the edge feedback loop.

2. The receiver module of claim 1, wherein each feedback loop comprises a direct feedback topology with an independent summation circuit.

3. The receiver module of claim 2, wherein each feedback loop further comprises a data slicer, and a feedback path between an output sample of the data slicer and the independent summation circuit.

4. The receiver module of claim 1, wherein each feedback loop comprises a loop unrolled topology.

5. The receiver module of claim 4, wherein the loop unrolled topology comprises a data slicer, a multiplexer, and a feedback path between an output sample of the data slicer and a control node of the multiplexer, wherein the multiplexer is configured to select either an input data stream combined with a positive equalization value or an input data stream combined with a negative equalization value in response to a control signal applied to the control node, and wherein the control signal is based on an output sample's sign.

6. The receiver module of claim 1, wherein the clock recovery circuit is configured to use at least two output samples from the data feedback loop and at least one output sample from the edge feedback loop to determine the phase error.

7. The receiver module of claim 6, wherein the clock recovery circuit comprises a loop filter coupled to a voltage-controlled oscillator (VCO), wherein the loop filter adjusts a voltage level applied to the VCO based on the determined phase error.

8. The receiver module of claim 7, further comprising a multi-phase clock generator configured to receive an output of the VCO and to generate the first and second clock signals.

9. The receiver module of claim 1, wherein the first clock signal and the second clock signal are full-rate signals relative to the input data stream, and are offset in phase from each other by 180 degrees.

10. The receiver module of claim 1, wherein the first clock signal and the second clock signal are half-rate signals relative to the input data stream, and are offset in phase from each other by 90 degrees.

11. The receiver module of claim 1, wherein DFE circuit has a feedback timing greater than 0.5 unit intervals and less than 1.0 unit intervals.

12. The receiver module of claim 1, wherein DFE circuit has a feedback timing less than 0.5 unit intervals.

13. A method that comprises:
    receiving an input data stream;
    using a data feedback loop to sample the input data stream combined with decision feedback equalizer (DFE) values from a first equalization logic and based on a first clock signal;
    using an edge feedback loop to sample the input data stream combined with DFE values from a second equalization logic, the second equalization logic being independent of the first equalization logic and based on a second clock signal that is different than the first clock signal;
    determining a phase error between a receiver clock signal and a target clock signal based on output samples from the data feedback loop and the edge feedback loop; and
    using the determined phase error to adjust the receiver clock signal.

14. The method of claim 13, further comprising:
    combining the input data stream with DFE values within a feedback path for the data feedback loop; and separately combining the input data stream with DFE values within a feedback path for the edge feedback loop.

15. The method of claim 14, further comprising selecting a DFE value for the data feedback loop based at least in part on an data feedback loop output sample's sign, and selecting a DFE value for the edge feedback loop based at least in part on an edge feedback loop output sample's sign.

16. The method of claim 13, further comprising:
combining the input data stream with positive and negative DFE values to generate first and second combination signals, and using a data feedback loop output sample's sign to select one of the first and second combination signals to sample; and
separately combining the input data stream with positive and negative DFE values to generate third and fourth combination signals, and using an edge feedback loop output sample's sign to select one of the third and fourth combination signals to sample.

17. The method of claim 13, wherein determining the phase error comprises analyzing at least two output samples from the data feedback loop and at least one output sample from the edge feedback loop.

18. The method of claim 13, further comprising generating the first and second clock signals, wherein the first and second signals are full-rate signals relative to the input data stream, and are offset in phase from each other by 180 degrees.

19. The method of claim 13, further comprising generating the first and second clock signals, wherein the first and second signals are half-rate signals relative to the input data stream, and are offset in phase from each other by 90 degrees.

20. The method of claim 13, further comprising delaying feedback timing for at least one of the data feedback loop and the edge feedback loop by a value between 0.5-1.0 unit intervals.

21. The method of claim 13, further comprising delaying feedback timing for at least one of the data feedback loop and the edge feedback loop by a value less than 0.5 unit intervals.

* * * * *